(12) United States Patent
Okita et al.

(10) Patent No.: US 8,278,613 B2
(45) Date of Patent: Oct. 2, 2012

(54) IMAGE SENSING APPARATUS AND IMAGE SENSING SYSTEM

(75) Inventors: Akira Okita, Yamato (JP); Takamasa Sakuragi, Hiratsuka (JP); Satoshi Suzuki, Hiratsuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 270 days.

(21) Appl. No.: 12/370,945

(22) Filed: Feb. 13, 2009

(65) Prior Publication Data

US 2009/0218477 A1 Sep. 3, 2009

(30) Foreign Application Priority Data

Feb. 29, 2008 (JP) .................................. 2008-051122

(51) Int. Cl.
*H03F 3/08* (2006.01)
(52) U.S. Cl. .................. 250/214 A; 250/208.1
(58) Field of Classification Search .............. 250/214 A, 250/208.1
See application file for complete search history.

(56) References Cited

U.S. PATENT DOCUMENTS

| | | | |
|---|---|---|---|
| 7,023,482 B2 | 4/2006 | Sakuragi | 348/308 |
| 7,187,052 B2 | 3/2007 | Okita et al. | 257/444 |
| 7,321,110 B2 | 1/2008 | Okita et al. | 250/208.1 |
| 7,408,210 B2 | 8/2008 | Ogura et al. | 257/233 |
| 7,460,162 B2 | 12/2008 | Koizumi et al. | 348/294 |
| 7,466,003 B2 | 12/2008 | Ueno et al. | 257/462 |
| 7,538,804 B2 | 5/2009 | Okita et al. | 348/241 |
| 7,538,810 B2 | 5/2009 | Koizumi et al. | 348/308 |
| 7,550,793 B2 | 6/2009 | Itano et al. | 257/239 |
| 7,557,847 B2 | 7/2009 | Okita et al. | 348/308 |
| 2003/0150976 A1 | 8/2003 | Mabuchi | 250/208.1 |
| 2006/0157759 A1 | 7/2006 | Okita et al. | 257/292 |
| 2008/0273093 A1 | 11/2008 | Okita et al. | 348/220.1 |
| 2009/0033781 A1 | 2/2009 | Okita et al. | 348/308 |
| 2009/0039956 A1 * | 2/2009 | Mo | 330/9 |
| 2009/0147117 A1 | 6/2009 | Suzuki et al. | 348/294 |

FOREIGN PATENT DOCUMENTS

JP 2003-234957 A 8/2003

* cited by examiner

*Primary Examiner* — Tony Ko
(74) *Attorney, Agent, or Firm* — Fitzpatrick, Cella, Harper & Scinto

(57) ABSTRACT

An image sensing apparatus having a pixel array with a plurality of pixels, comprises an amplification unit, wherein the amplification unit amplifies a difference-voltage between a voltage level input corresponding to signals output from the pixel array and a reference voltage level, outputs a non-inverted output signal to a first output signal line, and outputs an inverted output signal to a second output signal line and a switch short-circuiting the first output signal line and the second output signal line in response to a reset signal.

13 Claims, 10 Drawing Sheets

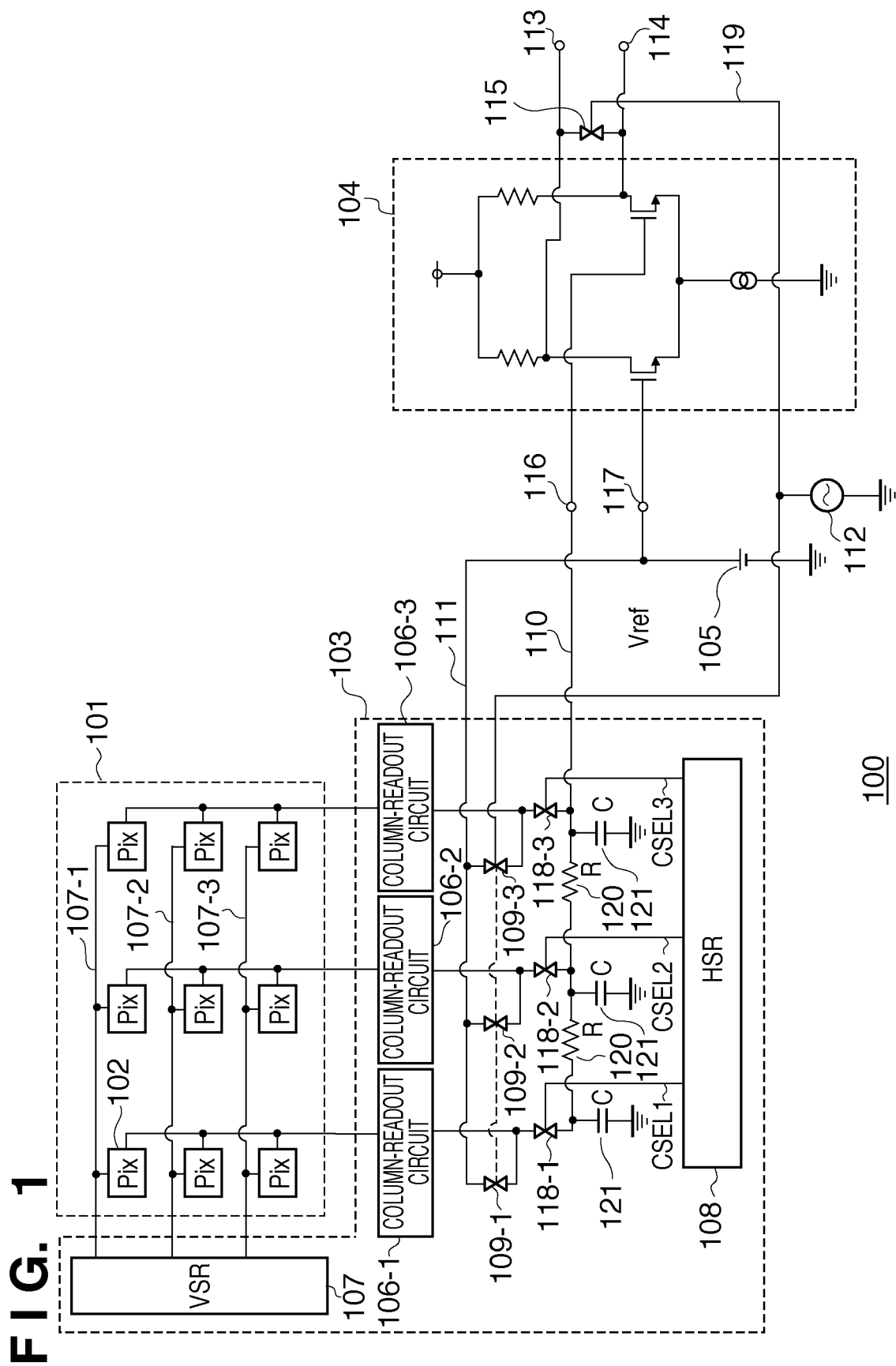

IMAGE SENSING APPARATUS AND IMAGE SENSING SYSTEM

BACKGROUND OF THE INVENTION

1. Field of the Invention

The present invention relates to an image sensing apparatus and an image sensing system equipped with the image sensing apparatus.

2. Description of the Related Art

An image sensing apparatus such as a CMOS image sensor requires a high-frequency clock for transfer in order to increase output speed of an image signal. However, when clock frequency is increased, it becomes impossible to ignore parasitic resistance and parasitic capacitance of a common readout line transmitting a signal from a pixel in the horizontal direction, thus the time required to charge and discharge the capacitance cannot be ignored. This is observed, for example, as a blunted waveform of an output signal from the image sensing apparatus or a signal within the image sensing apparatus.

The clock signal frequency, when it becomes higher than a certain level, causes a phenomenon in which a level of a signal waveform does not return to its original level until a next signal is input. Examples of inventions made to deal with this phenomenon can be seen in Japanese Patent Laid-Open No. 2003-234957. The invention has a differential amplifier circuit in an output stage of an image sensing apparatus to provide as accurate a signal as possible even if a signal waveform is blunted. However, to further increase output speed of an image signal, further innovation is required.

SUMMARY OF THE INVENTION

The present invention has been made in view of the above circumstances and has an object to provide a technique advantageous in speeding up signal output, for example, from an image sensing apparatus.

According to one aspect of the present invention, an image sensing apparatus including a pixel array with a plurality of pixels, includes an amplification unit having a first input terminal and a second input terminal, wherein the amplification unit amplifies a difference-voltage between a voltage level input to the first terminal corresponding to signals output from the pixel array and a reference voltage level supplied to the second input terminal, outputs a non-inverted output signal to a first output signal line, and outputs an inverted output signal to a second output signal line; and a switch short-circuiting the first output signal line and the second output signal line in response to a reset signal.

Further features of the present invention will become apparent from the following description of exemplary embodiments with reference to the attached drawings.

BRIEF DESCRIPTION OF THE DRAWINGS

FIG. 1 is a block diagram showing a first embodiment of the present invention;

DESCRIPTION OF THE EMBODIMENTS

Figure 2A:
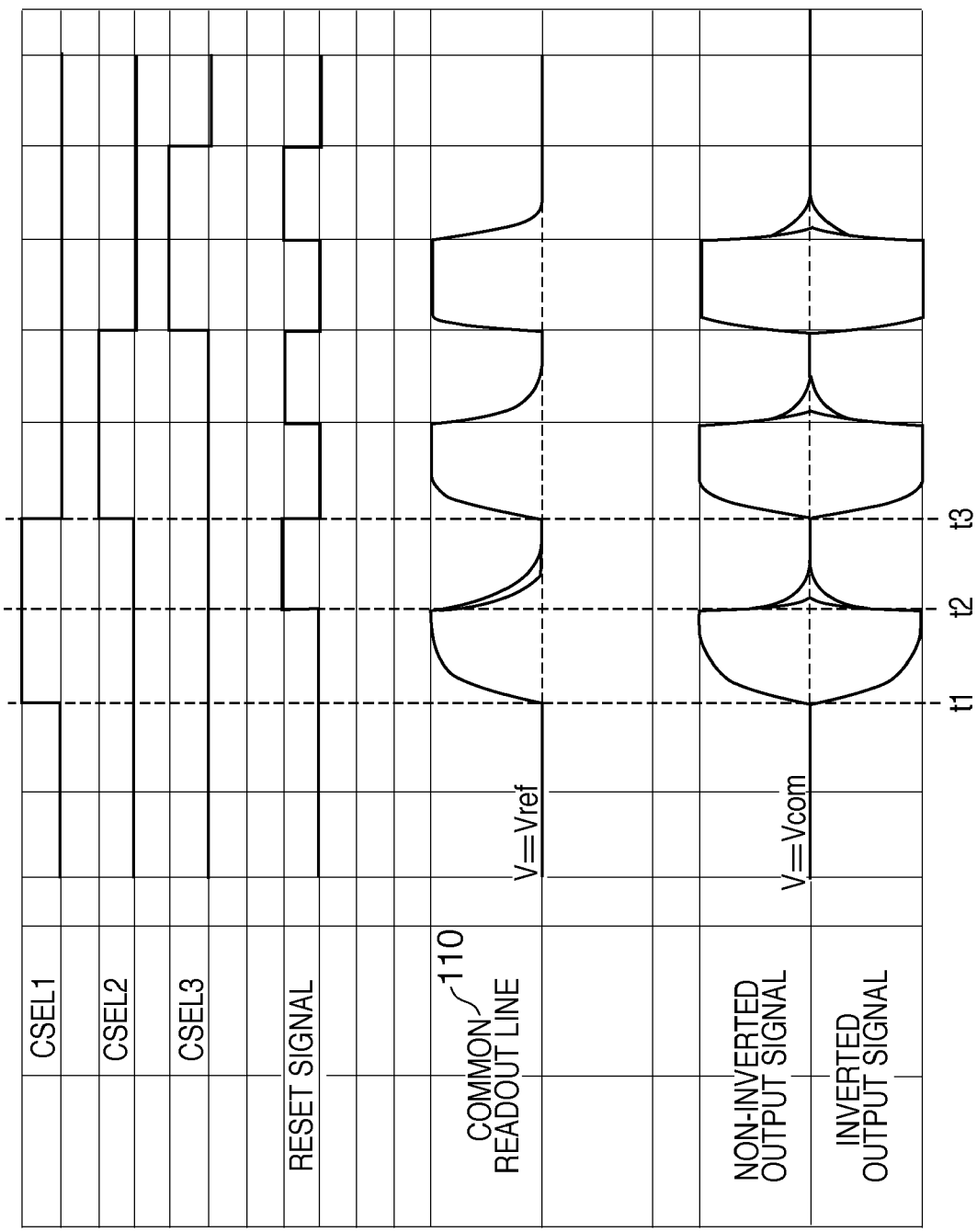
FIG. 2A is a timing chart of major signals according to the first embodiment of the present invention.

Preferred embodiments of the present invention will be described below with reference to FIGS. 1 to 8.

First Embodiment

FIG. 1 is a block diagram showing a first embodiment of an image sensing apparatus according to the present invention.

An image sensing apparatus 100 according to a preferred embodiment of the present invention includes a pixel array 101, signal processing circuit 103, amplifier circuit 104 which is part of an amplification unit, reference level supply unit 105, and reset signal supply unit 112. The pixel array 101 includes a plurality of pixels arranged two-dimensionally in row and column directions. Each of the pixels converts light power into electric charge. The signal processing circuit 103 includes a vertical shift register 107, a horizontal shift register 108, and column-readout circuits 106-1 to 106-3. The vertical shift register 107, which serves as a row-selection circuit or vertical scanning circuit, selects rows in the pixel array 101 using row-selection signal lines 107-1 to 107-3. Signals are read from the pixels in the selected rows by the column-readout circuits 106-1 to 106-3. The horizontal shift register 108, which serves as a column-selection circuit or horizontal scanning circuit, selects a plurality of column-selection switches 118-1 to 118-3 in a predetermined order via column-selection signal lines CSEL1 to CSEL3. Output from a selected column-readout circuit 106-1, 106-2, or 106-3 is transmitted to a common readout line 110.

A signal output from the signal processing circuit 103 to the common readout line 110 is amplified by the amplifier circuit 104 serving as the amplification unit. To bring two inputs in the amplifier circuit 104 to accord with a reference level, the image sensing apparatus 100 has the reference level supply unit 105 and the reset signal supply unit 112 which outputs a reset signal 119 to give a reference timing. A signal or level on the common readout line 110 is supplied to a first input terminal of the amplifier circuit 104 and the reference level Vref output from the reference level supply unit 105 is supplied to a second input terminal of the amplifier circuit 104. Also, the reference level supply unit 105 gives a reference potential level from a reset line 111 to the common readout line 110 via input-side switches 109-1 to 109-3. The reset signal supply unit 112 activates a timing signal which turns on the input-side switches 109-1 to 109-3, thereby setting the common readout line 110 to the reference level. Consequently, the amplifier circuit 104 operates such that levels of signals output from the amplifier circuit 104 to a first output signal line 113 and second output signal line 114 will approach each other.

FIG. 1 shows an example of the amplifier circuit 104 configured to be a differential amplifier circuit. The amplifier circuit 104 amplifies a differential signal between the signal or level supplied to the first input terminal 116 of the amplifier circuit 104 via the common readout line 110 and the reference level supplied to the second input terminal 117 of the amplifier circuit 104. The amplified differential signal is output as a non-inverted output signal to the first output signal line 113 of the amplifier circuit 104 and an inverted output signal thereof is output to the second output signal line 114. Output waveforms of the non-inverted output signal and inverted output signal are symmetrical with respect to the reference level.

A switch 115 is installed between the first output signal line 113 and second output signal line 114 to short-circuit the first output signal line 113 and second output signal line 114. The reset signal 119 supplied from the reset signal supply unit 112 to the switch 115 causes the switch 115 to turn to a conductive state. That is, even if a signal with a large potential difference from the reference level is input to the amplifier circuit 104, by short-circuiting the first output signal line 113 and second output signal line 114, it is possible to forcibly set output of the signal to a common voltage level Vcom before a next signal is input. The first embodiment is configured to provide a timing to reset levels of the switch 115 and the common readout line 110 using the single reset signal supply unit 112. However, another signal synchronized with the timing to reset the level of the common readout line 110 may be provided using a buffer or the like to cause the switch 115 to conduct between two terminals. Alternatively, timings may be supplied separately using two reset signal supply units.

Figure 2B:
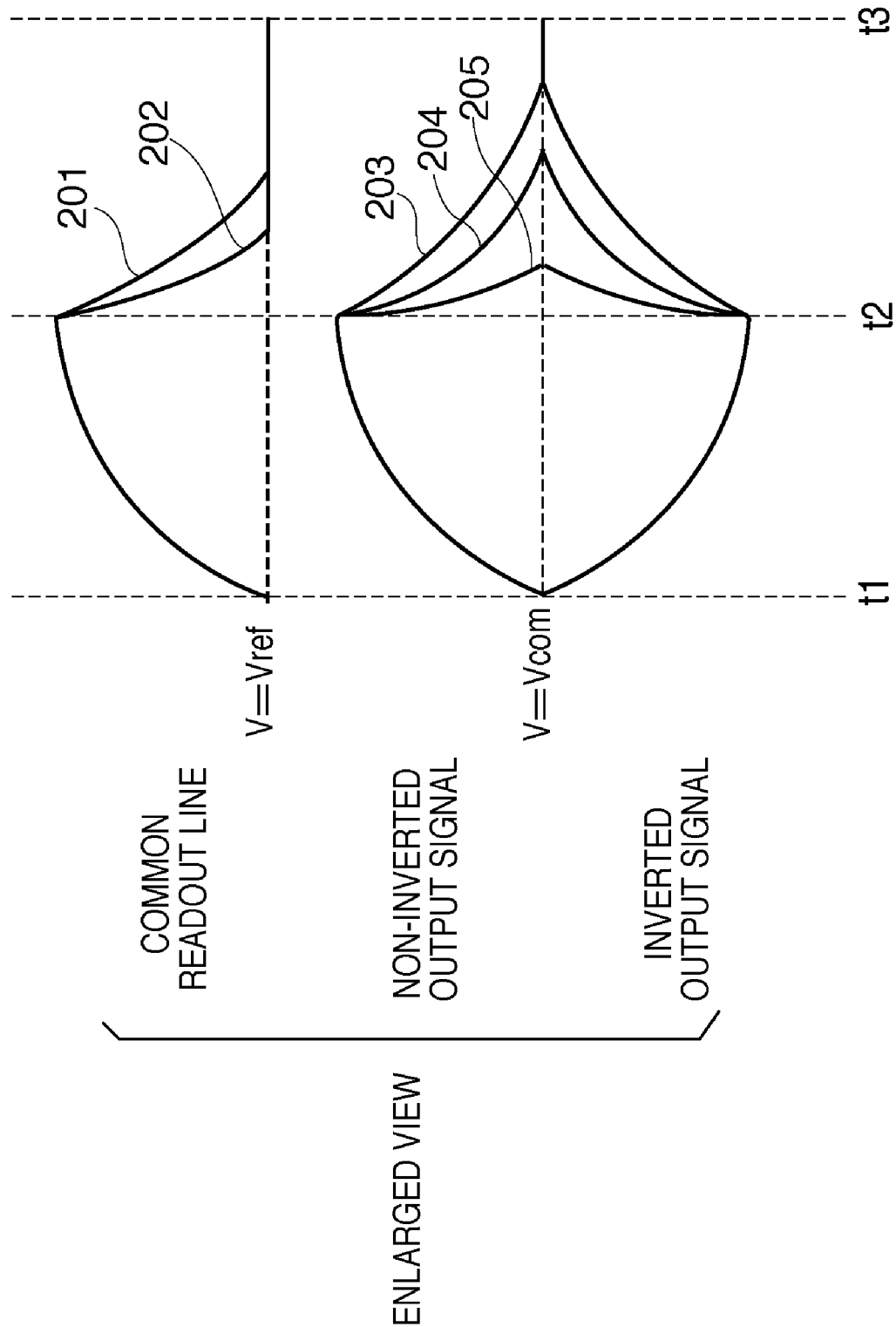
FIG. 2B is a detail view showing timings of major signals according to the first embodiment of the present invention.

FIG. 2A shows timing relationships among major signals according to the first embodiment and FIG. 2B shows details of the timing relationships.

At time t1, the column-readout circuit 106-1 is selected from among the column-readout circuits 106-1 to 106-3 and a signal waveform of the column-readout circuit 106-1 appears in output from the common readout line 110. The reset signal 119 is supplied to the switch 115 and input-side switches 109-1 to 109-3 during the period from t2 when the signal output is completed to t3 when a next signal is output. An input to the common readout line 110 near the amplifier circuit 104 has a waveform, for example, such as shown in FIG. 2A. It is noteworthy that an input signal waveform near the amplifier circuit 104 varies with differences in physical layout among the three column-readout circuits 106-1 to 106-3. The signal on the common readout line 110 is affected more greatly by parasitic resistance 120 and parasitic capacitance 121 of the common readout line 110 when transmitted from near the input-side switch 109-1 farthest from the amplifier circuit 104. Consequently, the waveform is blunted considerably during the period from t2 to t3 as exemplified by a signal waveform 201 of the common readout line 110 in FIG. 2B. That is, it takes a longer time to return to the reference level. In contrast, regarding the signal from the nearest switch 109-3, the signal waveform appearing in the output of the common readout line 110 to the amplifier circuit 104 is not affected much by the parasitic resistance 120 and parasitic capacitance 121 of the common readout line 110. Thus, the waveform is relatively sharp and takes a shorter time to return to the reference level, as exemplified by a signal waveform 202 in FIG. 2B.

Output of the amplifier circuit 104 is produced by amplifying a difference between the two inputs, and thus becomes more blunted than the input waveforms. Consequently, the non-inverted output signal output to the first output signal line 113 and inverted output signal output to the second output signal line 114 in FIG. 2A return to the reference level gradually over a considerable time, as exemplified by waveforms 203 and 204 in FIG. 2B. If the signal on the first input terminal 116 is far greater than the reference level, a next signal may be buried under the signal thus causing the next signal to be distinguishable from the current signal.

Thus, according to the preferred embodiment of the present invention, the reset signal 119 is supplied from the reset signal supply unit 112 to the switch 115, which then short-circuits the first output signal line 113 and second output signal line 114 in response to the reset signal 119. The reset signal 119 is supplied to the switch 115 and input-side switches 109-1 to 109-3 during the period from t2 when the signal output is completed to t3 when a next signal is output. This makes it possible to quickly set the first output signal line 113 and second output signal line 114 to the common voltage level Vcom, where the non-inverted output signal is output to the first output signal line 113 and the inverted output signal is output the second output signal line 114. When the first output signal line 113 and second output signal line 114 are short-circuited by the switch 115, a waveform 205 of the non-inverted output signal on the first output signal line 113 and inverted output signal on the second output signal line 114 is set to the common voltage level Vcom in a shorter time than the non-short-circuited waveforms 203 and 204. Consequently, the levels of the non-inverted output signal and inverted output signal are set to the common voltage level Vcom quickly regardless of the parasitic resistance 120 and parasitic capacitance 121 of the common readout line.

Second Embodiment

Figure 3:
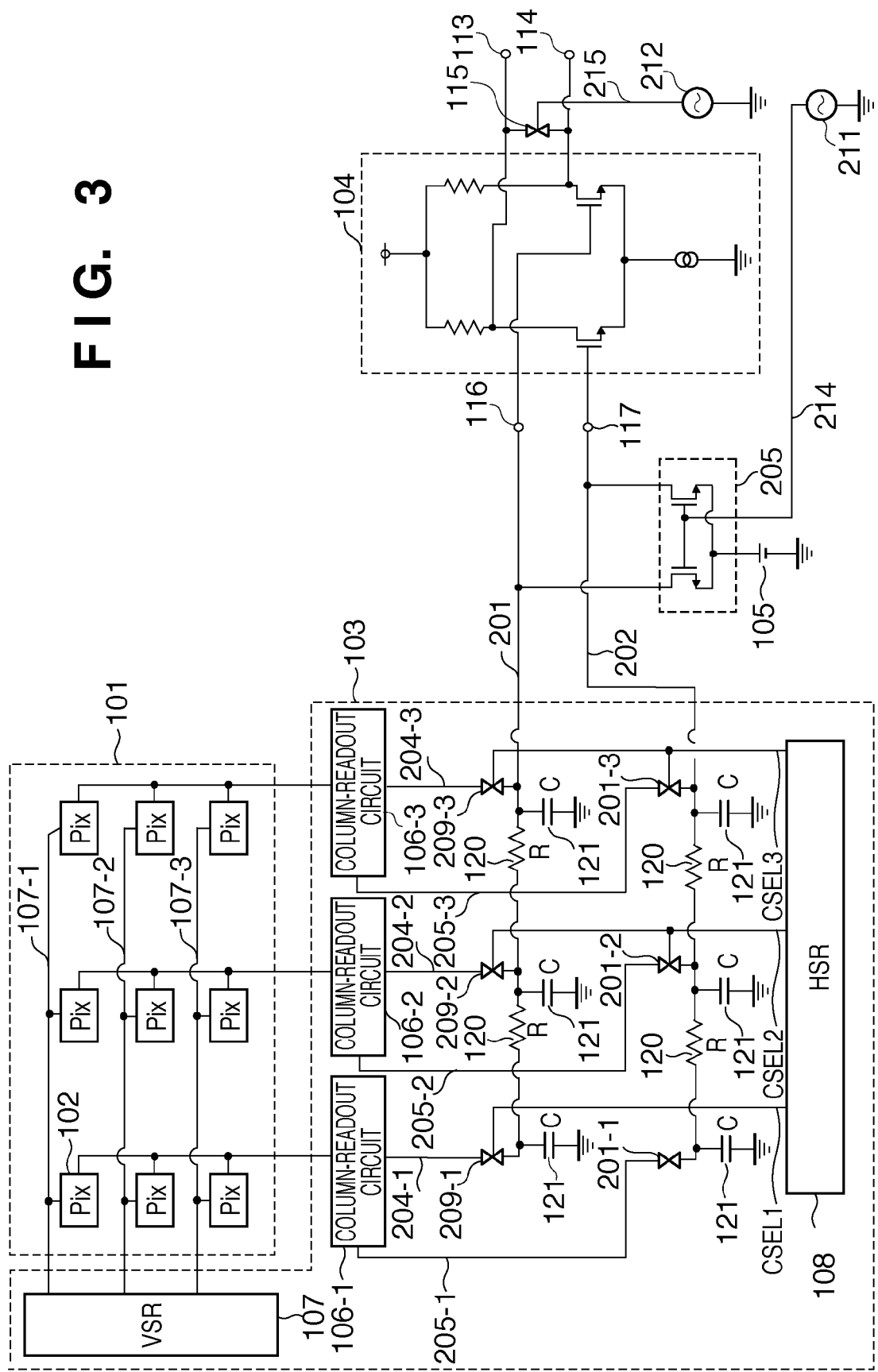
FIG. 3 is a block diagram showing a second embodiment of the present invention.
Figure 4:
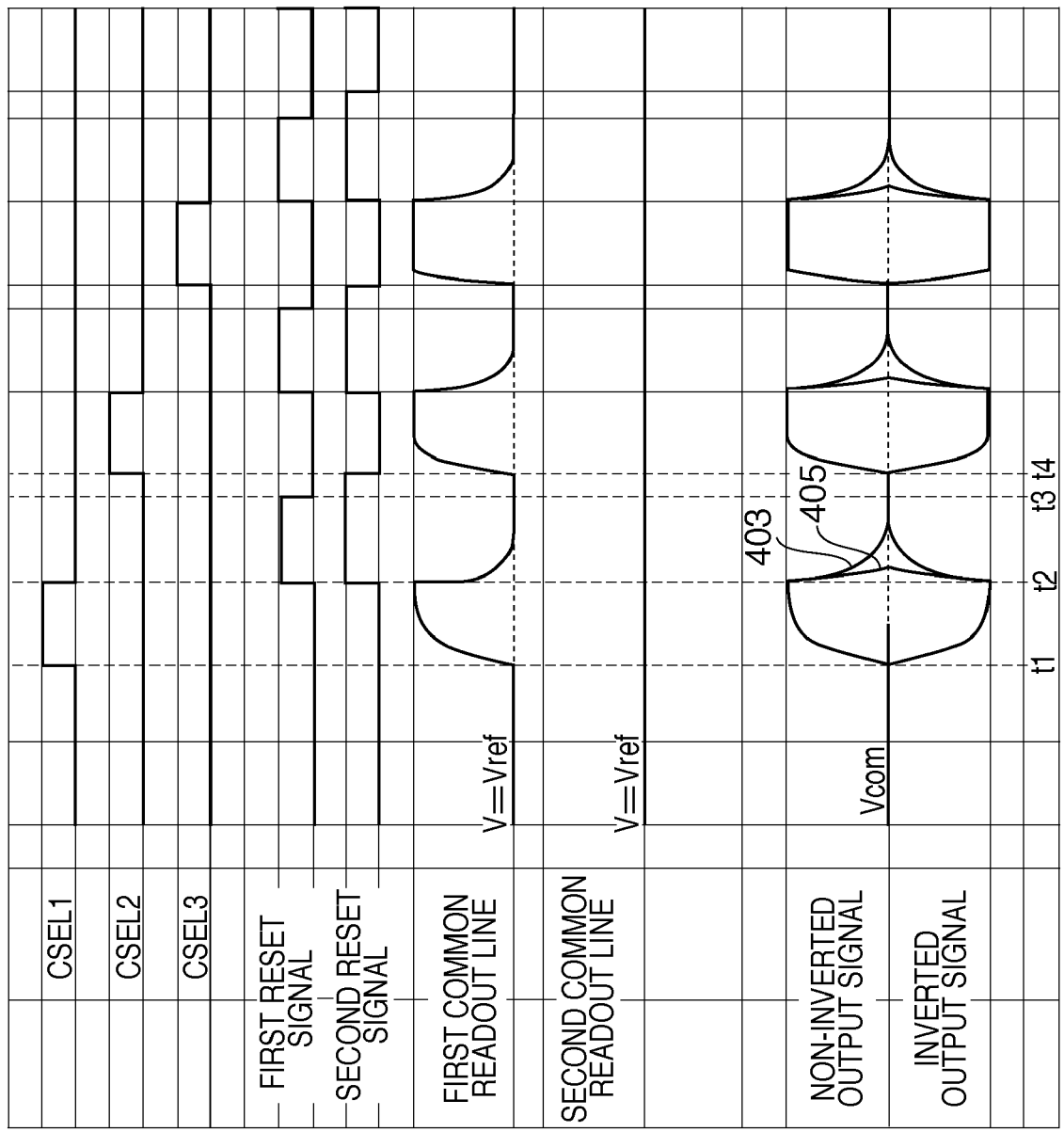
FIG. 4 is a timing chart of major signals according to the second embodiment of the present invention.

A block diagram and timing chart of a second embodiment of the present invention are shown in FIGS. 3 and 4.

An image sensing apparatus 100 according to the second embodiment includes a pixel array 101, signal processing circuit 103, amplifier circuit 104, reference level supply unit 105, and reset signal supply unit as in the case of the first embodiment. The second embodiment differs from the first embodiment in that a first common readout line 201 and second common readout line 202 are installed instead of the common readout line 110.

A signal from the pixel array 101 and offset voltages of the column-readout circuits 106-1 to 106-3 (offsets can occur due to other factors such as manufacturing variations) are transferred to the first common readout line 201 via first transfer signal lines 204-1 to 204-3. On the other hand, only the offset voltages of the column-readout circuits 106-1 to 106-3 are transferred to the second common readout line 202 via second transfer signal lines 205-1 to 205-3. The horizontal shift register 108 selectively turns on first input-side switches 209-1 to 209-3 and second input-side switches 201-1 to 201-3, and thereby selects the column-readout circuits 106-1 to 106-3 in a predetermined order.

The first input-side switches 209-1 to 209-3 are provided to input images and offset signals from the column-readout circuits 106-1 to 106-3 into the first input terminal 116 of the amplifier circuit 104 via the first common readout line 201. On the other hand, the second input-side switches 201-1 to 201-3 are provided to input the offset voltages output from the column-readout circuits 106-1 to 106-3 into the second input terminal 117 of the amplifier circuit 104 via the second common readout line 202.

Two reset signal supply units, namely, a first reset signal supply unit 211 and second reset signal supply unit 212, are installed to supply reset signals 214 and 215. The first reset signal supply unit 211 supplies the first reset signal 214 to an input-side reset switch 205 to reset the first common readout line 201 to the reference level and supplies the reference level to the second input terminal 117 of the amplifier circuit 104. On the other hand, the second reset signal supply unit 212 supplies the second reset signal 215 to the switch 115. Consequently, the first common readout line 201 and second common readout line 202 are set to the reference level and the amplifier circuit 104 operates such that levels of signals output from the amplifier circuit 104 to the first output signal line 113 and second output signal line 114 will approach each other.

Thus, by using the two common readout lines 201 and 202 and taking out the differential signal between the two common readout lines 201 and 202, the present embodiment makes it possible to eliminate offset voltages. Also, when the common readout lines 201 and 202 are arranged in parallel, external noise acts equally on the two common readout lines, making it possible to remove external noise components and thereby enabling noise-resistant readout.

The non-inverted output signal and inverted output signal are symmetrical with respect to the common voltage. Consequently, when the first output signal line 113 and second output signal line of the amplifier circuit 104 are short-circuited, the non-inverted output signal and inverted output signal approach the common voltage level Vcom, enabling a quick reset without being affected by unbalance between the two inputs.

FIG. 4 shows timing operations of major signals.

At time t1, the column-readout circuit 106-1 is selected from among the column-readout circuits 106-1 to 106-3 and a signal waveform of the column-readout circuit 106-1 appears in outputs from the first common readout line 201 and second common readout line 202. The first reset signal 214 is supplied to the switch 205 during the period from t2, when the signal output is completed, to t3. Also, the first reset signal 214 is supplied to the switch 115 during the period from t2 to t4 when a next signal is output. When the first output signal line 113 and second output signal line 114 are short-circuited by the switch 115, a waveform 405 of the non-inverted output signal from the first output signal line 113 and inverted output signal from the second output signal line 114 are set to the common voltage level Vcom in a shorter time than a non-short-circuited waveform 403. Consequently, the levels of the non-inverted output signal and inverted output signal are set to the common voltage level Vcom quickly regardless of the parasitic resistance 120 and parasitic capacitance 121 of the common readout lines.

However, there needs to be a time delay between fall time T=t3 of the first reset signal supply unit 211 and turn-on time T=t4 of the first input-side switches 209-1 to 209-3 and second input-side switches 201-1 to 201-3. Ideally, the first input-side switches 209-1 to 209-3 and second input-side switches 201-1 to 201-3 turn on simultaneously with a fall of the first reset signal supply unit. However, if the fall of the first reset signal supply unit 211 is timed to coincide with the turning-on of the first input-side switches 209-1 to 209-3 and second input-side switches 201-1 to 201-3, part of signals of the column-readout circuits 106-1 to 106-3 is reset. Consequently, signals on the first common readout line 201 and second common readout line 202 are neither reset to the reference level nor transferred during the period from t3 to t4.

On the other hand, activation of the switch 115 by the second reset signal supply unit 212 may be timed to coincide with the turning-on of the first input-side switches 209-1 to 209-3 and second input-side switches 201-1 to 201-3. This is because there is no fear that part of signals of the column-readout circuits 106-1 to 106-3 will be reset and the second reset signal supply unit 212 simply causes the first output signal line 113 and second output signal line 114 of the amplifier circuit 104 to turn to a conductive state, thereby short-circuiting two output signals. Thus, there is no problem if the time when the second reset signal supply unit 212 supplies the second reset signal 215 to the switch 115 coincides with the fall time t3 of the first input-side switches 209-1 to 209-3 and second input-side switches 201-1 to 201-3. This makes it possible to use time effectively for voltage setting and signal transfer.

Besides, the input-side reset switch 205, when placed close to the amplifier circuit 104, is also placed close to the switch 115, making it easy to synchronize the first reset signal supply unit 211 and second reset signal supply unit 212 with each other. The close placement alleviates problems such as time delay, making it possible to use time effectively for voltage setting and signal transfer.

Third Embodiment

Figure 5:
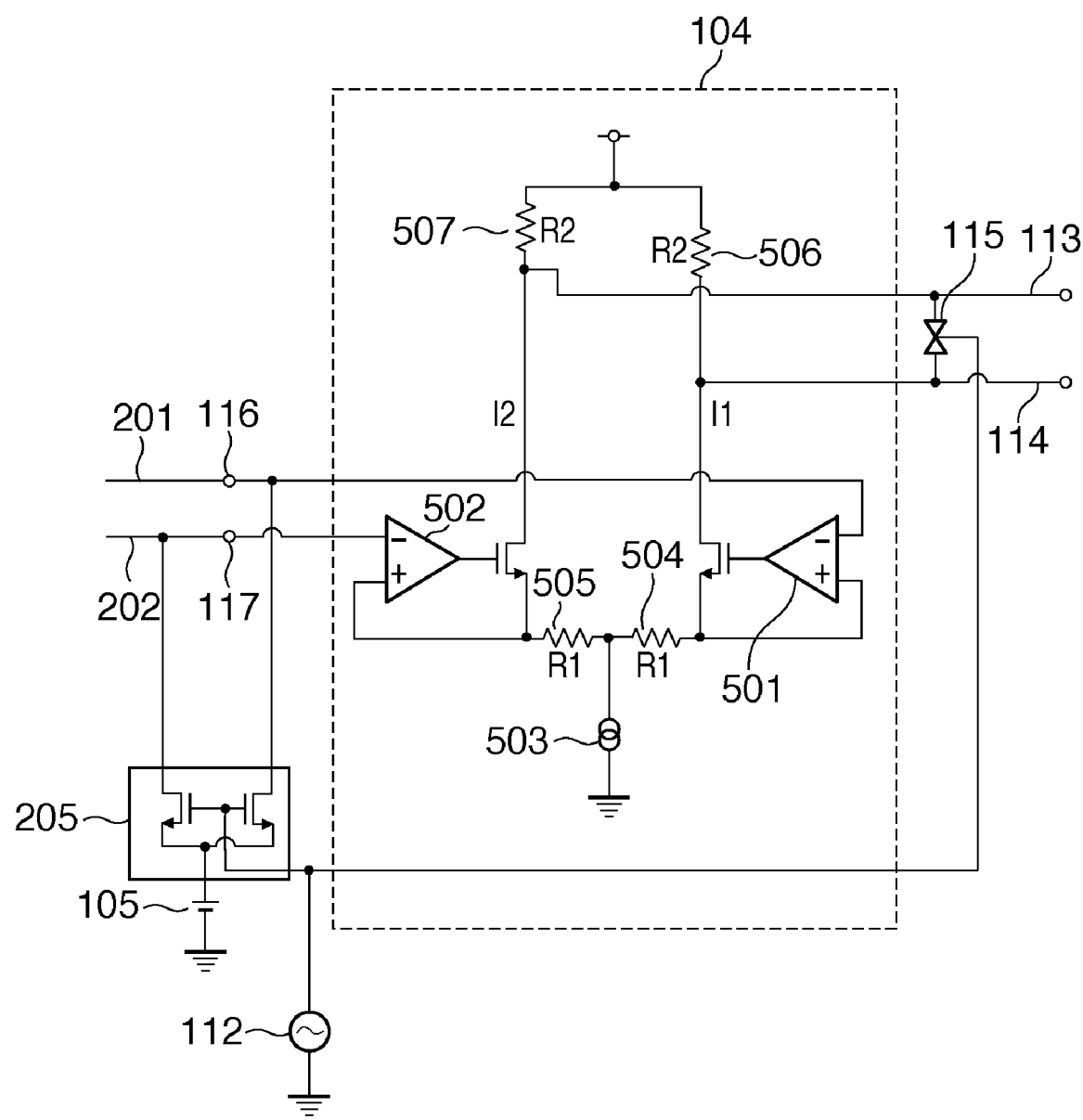
FIG. 5 is a block diagram showing an amplifier circuit according to a third embodiment of the present invention.

FIG. 5 is a circuit diagram showing a third embodiment of the present invention. The present embodiment differs from the first and second embodiments in amplifier circuit configuration. Up to and including a first input terminal and second input terminal of an amplifier circuit, the configuration of the present embodiment is the same as the second embodiment shown in FIG. 3. The amplifier circuit has two operation amplifiers 501 and 502 whose negative input terminals are connected to the first common readout line 201 and second common readout line 202, respectively. Besides the operation amplifiers, the amplifier circuit 104 has a constant current source 503 and resistors. Resistors 504 and 505 are resistive elements with a resistance of R1. Resistors 506 and 507 are resistive elements with a resistance of R2. A supply voltage of the circuit is denoted by VDD and a current flowing through the resistors 504 and 506 is denoted by $I_1$. A current flowing through the resistors 505 and 507 is denoted by $I_2$. A potential at a connection point between the resistors 504 and 505 is denoted by $V_0$. Potentials of the first common readout line 201 and second common readout line 202 are denoted by $V_{chs}$ and $V_{chn}$, respectively. Outputs of the first common readout line 201 and second common readout line 202 are denoted by $V_{out}$ and $V_{outB}$, respectively. Then, a relationship between an output difference and input difference of the amplifier circuit is calculated as follows:

$$V_{out} = V_{DD} - R_2 * I_2 \quad (1)$$

$$V_{outB} = V_{DD} - R_2 * I_2 \quad (2)$$

Hence, $$V_{out} - V_{outB} = R_2 * (I_1 - I_2) \quad (3)$$

On the other hand, $$V_{chs} = V_0 + R_1 * I_1 \quad (4)$$

$$V_{chn} = V_0 + R_1 * I_2 \quad (5)$$

Hence, $$V_{chs} - V_{chn} = R_1 * (I_1 - I_2) \quad (6)$$

From equations (3) and (6), we obtain $$V_{out} - V_{outB} = (R_2/R_1) * (V_{chs} - V_{chn}) \quad (7)$$

Thus, when the amplifier circuit 104 is configured as shown in FIG. 5, the differential output voltage is given by the product of the differential input voltage and a gain of R2/R1, producing an output with good linearity.

Also in the present embodiment, the switch 115 may, of course, be installed in the amplifier circuit 104, making it possible to forcibly set the first output signal line 113 and second output signal line 114 to the common voltage level Vcom by a short-circuit.

Fourth Embodiment

Figure 6:
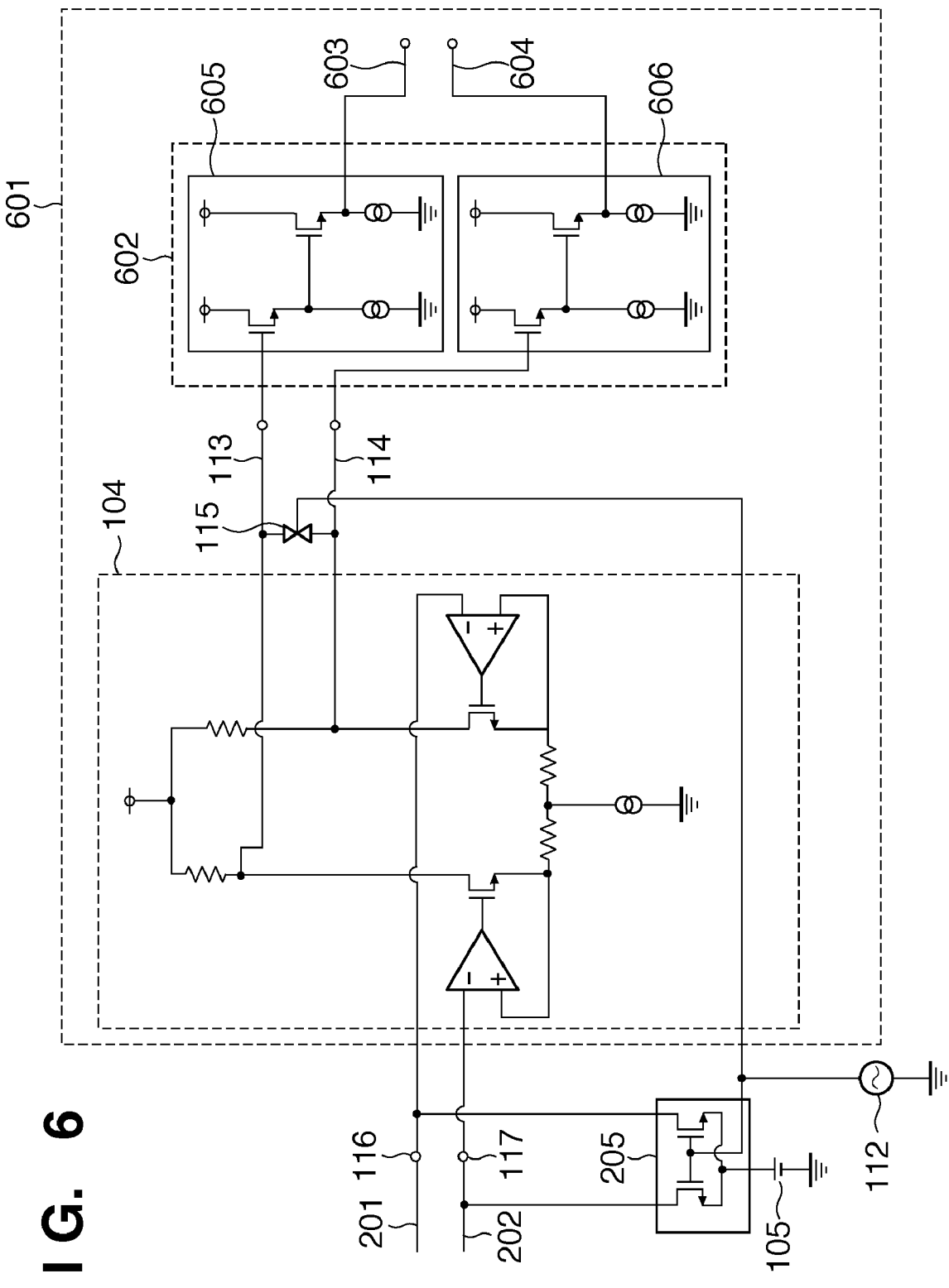
FIG. 6 is a block diagram showing an amplifier circuit according to a fourth embodiment of the present invention.

FIG. 6 is a circuit diagram showing a fourth embodiment of the present invention. In FIG. 6, an amplification unit 601 has an amplifier circuit 104 and buffer circuit 602.

The present embodiment differs from the third embodiment in that the buffer circuit 602 for output buffering is installed downstream of the switch 115 which in turn is installed downstream of the amplifier circuit 104. The buffer circuit 602 is provided for the non-inverted output signal from the first output signal line 113 and inverted output signal from the second output signal line 114. Specifically, the buffer circuit 602 includes a first buffer circuit 605 which buffers the non-inverted output signal and a second buffer circuit 606 which buffers the inverted output signal.

By short-circuiting the switch 115 in preparation for the output from the amplifier circuit 104, the present embodiment also makes it possible to forcibly set the first output signal line 113 and second output signal line 114 to the common voltage level Vcom. Also, the use of the buffer circuit 602 makes it possible to drive a larger output load. Incidentally, although the single reset signal supply unit 112 is used according to the present embodiment to supply a reset timing to the input-side reset switch 205 and the switch 115, two separate reset signal supply units 211 and 212 may be used as in the case of the second embodiment.

Fifth Embodiment

Figure 7:
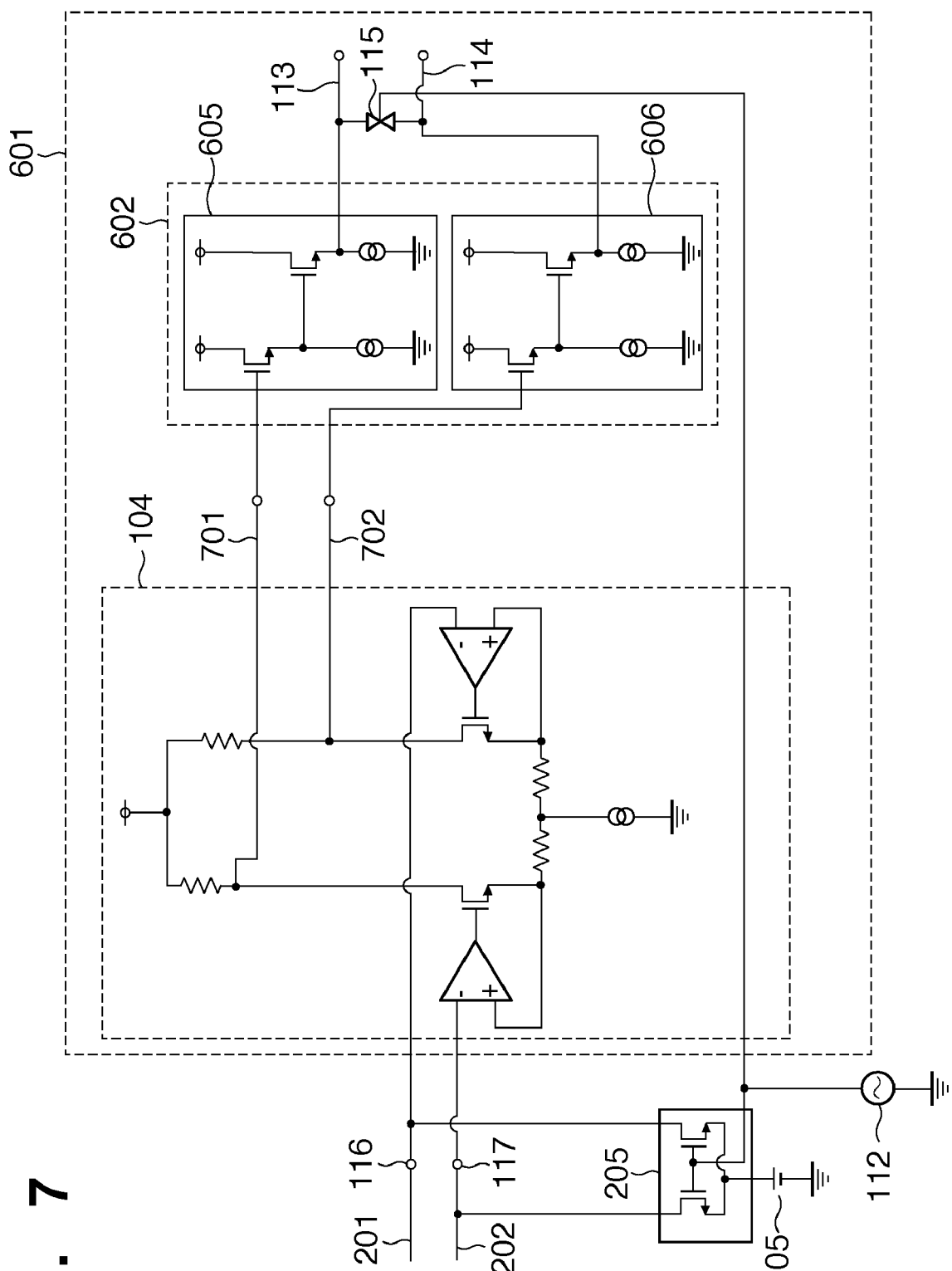
FIG. 7 is a block diagram showing an amplifier circuit according to a fifth embodiment of the present invention.

FIG. 7 is a circuit diagram showing a fifth embodiment of the present invention. In FIG. 7, an amplification unit 601 has an amplifier circuit 104 and buffer circuit 602.

The present embodiment differs from the third embodiment in that the buffer circuit 602 is installed in the following stage of the amplifier circuit 104 and that the switch 115 is installed in the following stage of the buffer circuit 602 to short-circuit the first output signal line 113 and second output signal line 114. The buffer circuit 602 includes a first buffer circuit 605 which buffers a first non-inverted output signal 701 and a second buffer circuit 606 which buffers a first inverted output signal 702, where the first non-inverted output signal 701 and first inverted output signal 702 are output from the amplifier circuit 104. The first buffer circuit 605 outputs the buffered signal as a non-inverted output signal to the first output signal line 113 and the second buffer circuit 606 outputs the buffered signal as an inverted output signal to the second output signal line 114.

By short-circuiting the switch 115, it is possible to forcibly set the non-inverted output signal and inverted output signal to the common voltage level Vcom, where the non-inverted output signal is output from the first buffer circuit 605 to the first output signal line 113 and the inverted output signal is output from the second buffer circuit 606 to the second output signal line 114. Incidentally, although the single reset signal supply unit 112 is used according to the present embodiment to supply a reset timing to the input-side reset switch 205 and the switch 115, two separate reset signal supply units 211 and 212 may be used as in the case of the second embodiment.

Others

In the embodiments described above, the column-readout circuit may be, for example, a circuit which amplifies a signal from a pixel array, a CDS circuit which removes a noise component contained in the pixel array, or capacitor which temporarily holds the signal from the pixel array.

Figure 9:
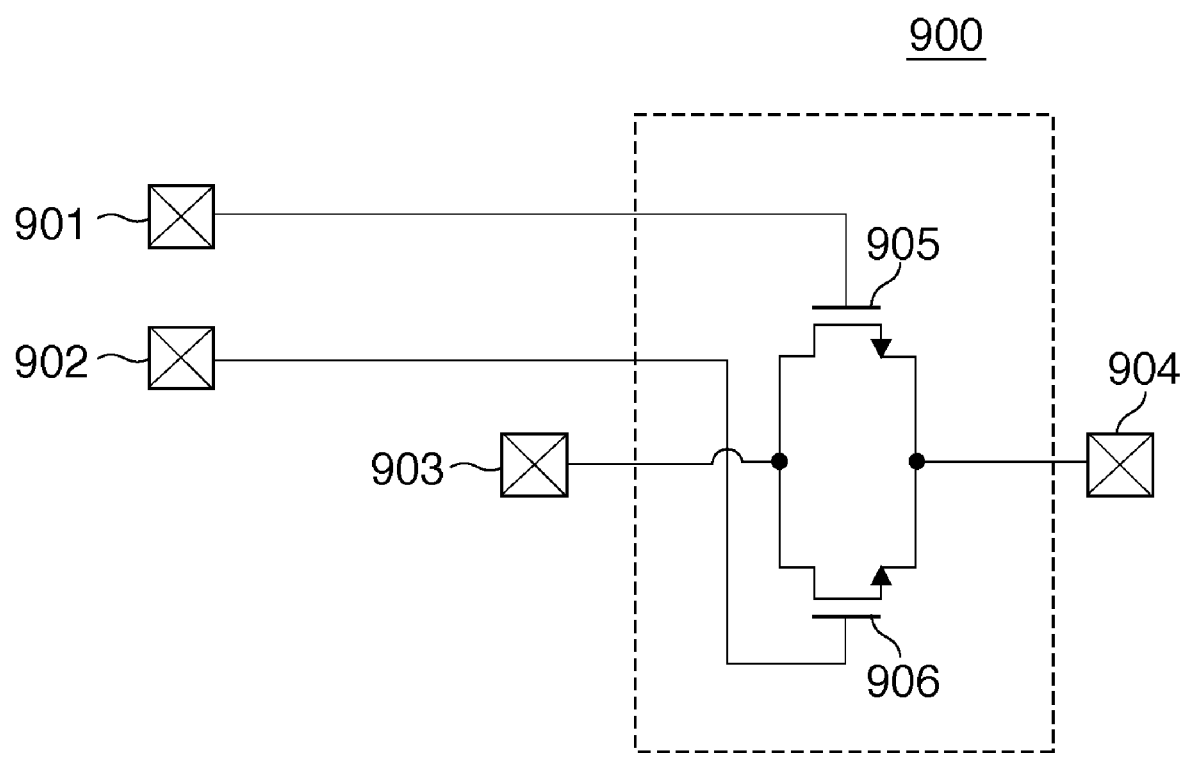
FIG. 9 is a diagram showing an example of a switch according to the present invention.

FIG. 9 shows a MOS switch 900 which is an example of the switch 115 according to the first to fifth embodiments, the switch 115 being used in an image sensing apparatus (semiconductor chip) formed on a semiconductor substrate. The first output signal line 113 and second output signal line 114 of the amplification unit 601 are connected, respectively, to a first output-pad 903 and second output-pad 904 of the MOS switch 900. The MOS switch 900 has gates: a first input-pad 901 and second input-pad 902 which receive reset signals. Also, the MOS switch 900 has two transistors as operation switches: an NMOS transistor 905 and a PMOS transistor 906. An active high reset signal is input to the first input-pad 901, causing the NMOS transistor 905 to turn to a conductive state. At the same time, an active low inverted reset signal obtained by inverting the active high reset signal as a logical level is input to the second input-pad 902, causing the PMOS transistor 906 to turn to a conductive state. As the NMOS transistor 905 and PMOS transistor 906 start to turn to their conductive states simultaneously, the levels of the non-inverted output signal and inverted output signal output to the first output signal line 113 and second output signal line 114 of the amplification unit 601 can be set to the common voltage level Vcom quickly.

The MOS switch 900 can conduct any signal ranging from a power supply signal to a ground signal at low resistance. By simultaneously inputting a positive logic reset signal and a negative logic reset signal (which is obtained by inverting the positive logic reset signal), it is possible to reduce noise radiated externally from the semiconductor substrate and suppress noise signals introduced into a sensor.

A technique is known for installing an amplifier for each pixel row in a solid-state image sensing apparatus. As an option for the first embodiment, it is conceivable to install an amplifier for each pixel row in the signal processing circuit 103 shown in FIG. 1. That is, although the amplifier circuit 104 is shared by all pixel columns in FIG. 1, the amplifier circuit 104 may be installed for each of the pixel columns. For example, each of the column-readout circuits 106-1 to 106-3 may include the same configuration as the amplifier circuit 104. In that case, signals from the pixel columns will be input to the first input terminals of the respective amplifier circuits and a reference level will be input to the second input terminals. Then, each amplifier circuit will amplify a difference between the two inputs, and output a non-inverted output signal to the first output signal line 113, and an inverted output signal to the second output signal line 114.

Even when the amplification unit according to the present invention is installed for each column of the pixel array, it is possible to output the common voltage level Vcom quickly by causing a short-circuit between the outputs of the amplifier circuit. Generally, the amplifier circuit 104, for example, shown in FIG. 1 needs to operate faster than the amplification unit installed for each column of the pixel array. Thus, the present invention is particularly useful when the amplifier circuit is shared by multiple columns of the pixel array as shown in FIGS. 1 and 3. The image sensing apparatus 100 is generally formed on a semiconductor substrate and an output unit (not shown) of the image sensing apparatus 100 is included in the amplification unit 601.

Sixth Embodiment

Figure 8:
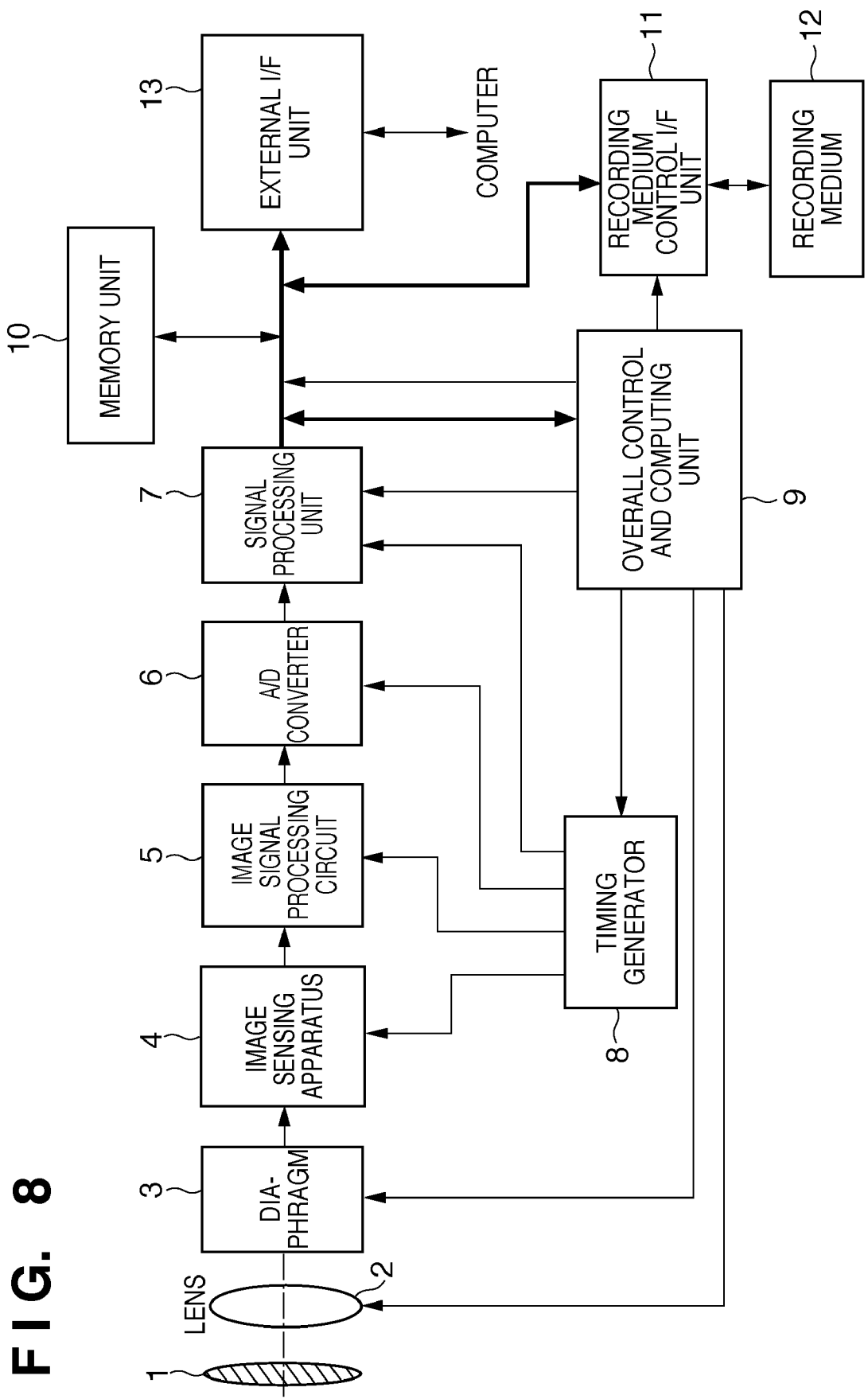
FIG. 8 is a system diagram showing an entire image sensing apparatus according to the present invention.

FIG. 8 is a block diagram of an image sensing system equipped with the image sensing apparatus according to the embodiments described above. In its optical system which forms an image on an image sensing plane, the image sensing system includes a barrier 1 which combines a lens protector and main switch, a lens 2 which forms an optical image of a subject on an image sensing element 4, and a diaphragm 3 which regulates light power passing through the lens 2. Also, the image sensing system includes the image sensing apparatus 4 which captures the subject image formed by the lens 2, as an image signal. The image sensing apparatus 4 is configured in the same manner as the image sensing apparatus according to the embodiments described above. Furthermore, the image sensing system includes an image signal processing circuit 5 which performs various corrections, clamping, and other processing on an image signal output from the image sensing apparatus 4, an A/D converter 6 which carries out analog-digital conversion of the image signal output from the image sensing element 4, and a signal processing unit 7 which makes various corrections to the image data output from the A/D converter 6 and compresses the data. Also, the image sensing system includes a timing generator 8 which outputs various timing signals to the image sensing apparatus 4, image signal processing circuit 5, A/D converter 6, and signal processing unit 7. Incidentally, the circuits 5 to 8 may be formed on the same chip as the image sensing apparatus 4. Besides, the image sensing system includes an overall control and computing unit 9 which performs various computations and controls an entire still video camera, a memory unit 10 which temporarily stores image data, a recording medium control interface unit 11 which records and reads data on/from a recording medium, a removable recording medium 12, such as a semiconductor memory, used to record or read image data, and an external interface (I/F) unit 13 used to communicate with an external computer or the like.

Next, operation of the image sensing system in FIG. 8 will be described. When the barrier 1 is opened, main power is turned on. Then, a control system is turned on and image sensing circuits including the A/D converter 6 are turned on. Next, the overall control and computing unit 9 fully opens the diaphragm 3 to control an amount of exposure, and a signal from the image sensing apparatus 4 is output to the A/D converter 6 through the image signal processing circuit 5. The A/D converter 6 carries out analog-digital conversion of the signal and outputs a resulting signal to the signal processing circuit 7. The signal processing unit 7 makes the overall control and computing unit 9 calculate exposure based on the data from the A/D converter 6.

The overall control and computing unit 9 determines brightness based on results of metering and controls the diaphragm accordingly. Next, the overall control and computing unit 9 extracts a high-frequency component from the signal output from the image sensing apparatus 4 and calculates distance to the subject. After that, by driving the lens 2, the overall control and computing unit 9 determines whether or not focus has been achieved. If it is determined that focus has not been achieved, the overall control and computing unit 9 measures the distance by driving the lens 2 again.

When it is confirmed that focus has been achieved, an actual exposure is started. When the exposure is finished, an image signal output from the image sensing apparatus 4 is subjected to correction by the image signal processing circuit 5, subjected to analog-digital conversion by the A/D converter 6, and accumulated in the memory unit 10 by the overall control and computing unit 9 via the signal processing unit 7. Subsequently, the data in the memory unit 10 is stored in the removable recording medium 12 such as a semiconductor memory via the recording medium control interface unit under the control of the overall control and computing unit 9.

Also, the data may be input directly in a computer or the like via the external interface unit 13 to manipulate images.

The present invention provides a technique advantageous in speeding up signal output, for example, from an image sensing apparatus.

Thus, when applied to an image sensing apparatus, the present invention enables building a high-quality image sensing system.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-051122, filed Feb. 29, 2008, and which is hereby incorporated by reference herein in its entirety.

What is claimed is:

1. An image sensing apparatus having a pixel array with a plurality of pixels, comprising:
    a signal processing circuit for processing signals output from the pixel array;
    an amplification unit having a first input terminal and a second input terminal;
    a common readout line connected to the first input terminal of the amplification unit; and
    a reference level supply unit for supplying a reference level, wherein
    the signal processing circuit comprises:
    a plurality of column-readout circuits for reading the signals from the pixel array;
    a column-selection circuit for selecting the signals read by the plurality of column-readout circuits to be output to the common readout line;
    an input-side reset switch for resetting a level of the common readout line to the reference level; and
    column-selection switches for connecting the column-readout circuits associated with the signal selected by said column-selection circuit to the common readout line based on a signal from the column-selection circuit,
    the amplification unit amplifies a difference-voltage between a voltage level input to the first terminal corresponding to signals output from the pixel array and a reference voltage level supplied to the second input terminal, outputs a non-inverted output signal to a first output signal line, and outputs an inverted output signal to a second output signal line,
    a short-circuit switch short-circuits the first output signal line and the second output signal line in response to a reset signal, and
    the input-side reset switch resets a level of the common readout line using the reference level which is supplied to the common readout line through the column-selection switch.

2. The image sensing apparatus according to claim 1, wherein said input-side reset switch is controlled in synchronization with the reset signal and sets the level of the common readout line to the reference level.

3. The image sensing apparatus according to claim 1, further comprising:
    the common readout line including a first common readout line to which the signals read from the pixel array by said plurality of column-readout circuits are output; and
    a second common readout line to which a noise signal from said plurality of column-readout circuits are output as the reference level, wherein said amplification unit amplifies a difference-voltage between the signals output to the first common readout line and the signal output to the second common readout line.

4. The image sensing apparatus according to claim 3, wherein said input-side reset switch sets a level of the first common readout line and a level of the second common readout line to the reference level supplied by said reference level supply unit.

5. The image sensing apparatus according to claim 1, wherein said amplification unit comprises:
  an amplifier circuit for amplifying a difference-voltage between a signal level supplied from said signal processing circuit to the first input terminal and the reference level supplied to the second input terminal; and
  a buffer circuit for buffering a signal level corresponding to the difference-level amplified by said amplifier circuit.

6. The image sensing apparatus according to claim 5, wherein said amplifier circuit outputs the non-inverted output signal to the first output signal line and outputs the inverted output signal to the second output signal line, and
  said buffer circuit comprises:
  a first buffer circuit for buffering the non-inverted output signal; and
  a second buffer circuit for buffering the inverted output signal.

7. The image sensing apparatus according to claim 5, wherein said amplifier circuit outputs a first non-inverted output signal and a first inverted output signal, and
  said buffer circuit includes
  a first buffer circuit for buffering the first non-inverted output signal and outputting the first non-inverted output signal as the non-inverted output signal to the first output signal line, and
  a second buffer circuit for buffering the first inverted output signal and outputting the first inverted output signal as the inverted output signal to the second output signal line.

8. The image sensing apparatus according to claim 1, wherein said amplification unit is installed for each column in the pixel array.

9. The image sensing apparatus according to claim 1, wherein
  the image sensing apparatus is configured as a semiconductor chip having a first output-pad and a second output-pad, wherein
  said first output-pad is connected with the first output signal line and said second output-pad is connected with the second output signal line.

10. The image sensing apparatus according to claim 9, wherein said semiconductor chip further comprises an input-pad for receiving the reset signal.

11. The image sensing apparatus according to claim 10, wherein said short-circuit switch comprises a MOS transistor for short-circuiting the first output signal line and the second output signal line in response to the reset signal supplied to a gate.

12. The image sensing apparatus according to claim 11, wherein
  said semiconductor chip further comprises a second input-pad for receiving an inverted reset signal which has a logic level obtained by inverting the reset signal, wherein the reset signal is active high and the inverted reset signal is active low, and
  said short-circuit switch comprises:
  an NMOS transistor for short-circuiting the first output signal line and the second output signal line in response to the reset signal supplied to a gate; and
  a PMOS transistor for short-circuiting the first output signal line and the second output signal line in response to the inverted reset signal supplied to the gate.

13. An image sensing system comprising:
  the image sensing apparatus according to claim 1;
  an optical system for forming an image on an image sensing plane of the image sensing apparatus; and
  a signal processing unit for processing a signal output from the image sensing apparatus and thereby generating image data.

* * * * *